United States Patent [19]
Noda

[11] Patent Number: 5,373,479
[45] Date of Patent: Dec. 13, 1994

[54] LOW-POWER CONSUMPTION SIMPLE ROW ADDRESSING SYSTEM INCORPORATED IN SEMICONDUCTOR MEMORY DEVICE FOR BOOSTING SELECTED WORD LINE OVER POWER VOLTAGE LEVEL

[75] Inventor: Kenji Noda, Tokyo, Japan

[73] Assignee: NEC Corporation, Tokyo, Japan

[21] Appl. No.: 67,091

[22] Filed: May 26, 1993

[30] Foreign Application Priority Data

May 26, 1992 [JP] Japan ................................. 4-133127

[51] Int. Cl.$^5$ .............................................. G11C 7/00
[52] U.S. Cl. ........................... 365/230.06; 365/230.01; 365/203; 365/189.11; 365/205
[58] Field of Search .................. 365/230.06, 230.01, 365/203, 189.11, 205

[56] References Cited
U.S. PATENT DOCUMENTS 4,503,522  3/1985  Etoh et al. ........................ 365/203
4,704,706  11/1987  Nakano et al. ..................... 365/203

FOREIGN PATENT DOCUMENTS 60-61996  4/1985  Japan .
63-292488  11/1988  Japan .
3-105797  5/1991  Japan .

OTHER PUBLICATIONS

IBM TDB, "High performance complementary decoder/driver circuit", vol. 29, No. 6, Nov./1986, pp. 2390-2394.
K. Komatsuzaki et al., "Circuit Techniques For a Wide Word I/O Path 64 Meg DRAM", pp. 133-134.

Primary Examiner—Viet Q. Nguyen
Attorney, Agent, or Firm—Sughrue, Mion, Zinn, Macpeak & Seas

[57] ABSTRACT

A row addressing system is responsive to row address bits for selecting one of row addresses respectively assigned to word lines, and comprises a row address buffer unit for producing row address predecoded signals from said row address bits, a word line driving unit responsive to a row address decoded signal for selectively driving the word lines and a row address decoder unit including a plurality of row address decoder circuits coupled between the row address buffer unit and the word line driving unit, wherein each row address decoder circuit has a flip flop circuit coupled between a boosted voltage line and a pair of output nodes for maintaining voltage levels at the pair of output nodes, a reset circuit coupled between one of the output nodes and a ground voltage line and responsive to a precharging signal of a power voltage level for charging the other output node to the boosted voltage level, and a decoder coupled between the other output node and the ground voltage line and responsive to the row address predecoded signals for producing the row address decoded signal so that the precharging signal of the power voltage level decreases current consumption without sacrifice of simple circuit arrangement.

10 Claims, 8 Drawing Sheets

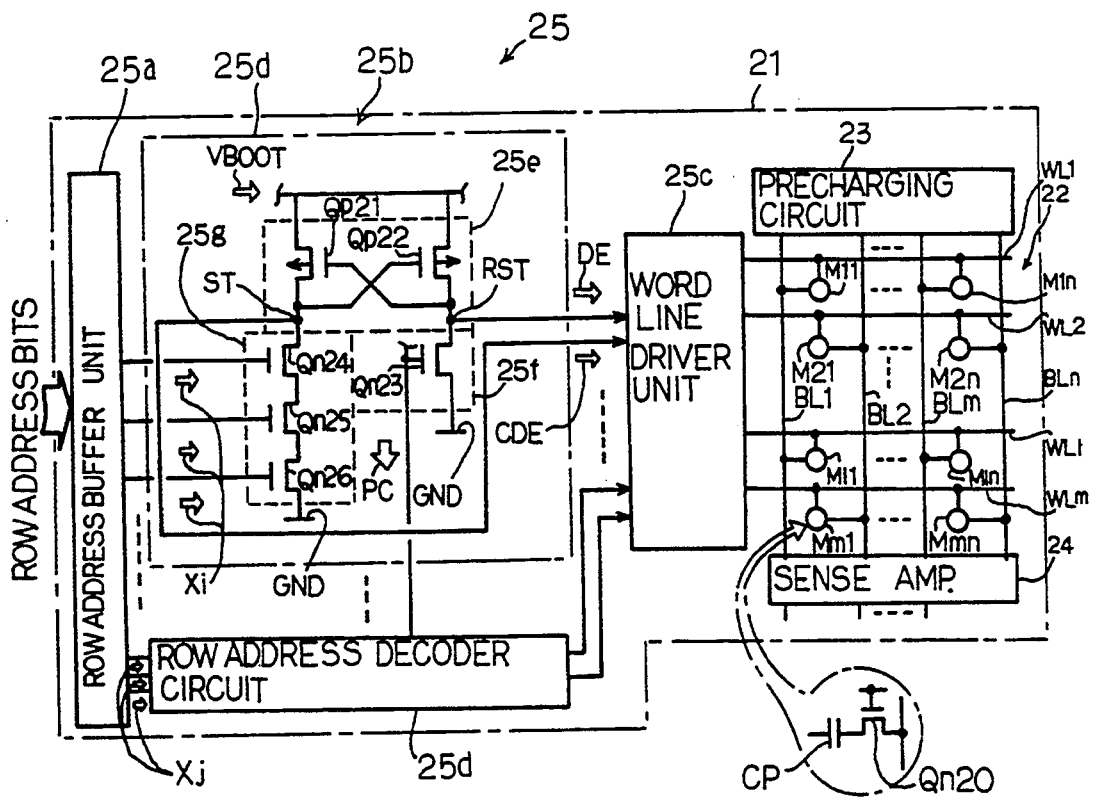
Fig. 11a
Fig. 11b
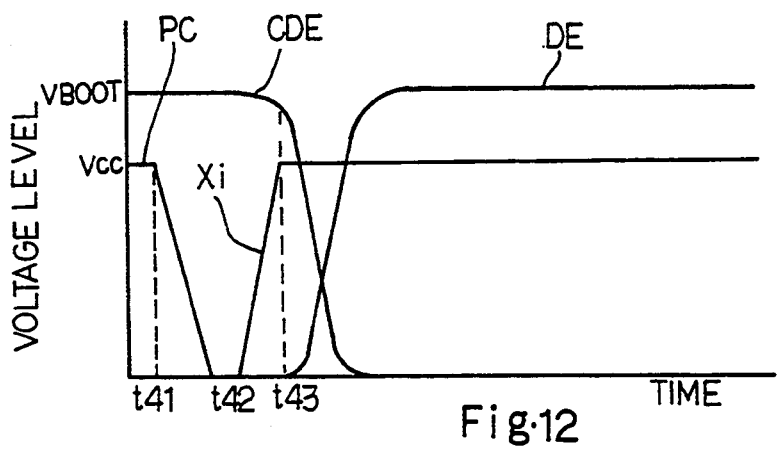
Fig. 12

LOW-POWER CONSUMPTION SIMPLE ROW ADDRESSING SYSTEM INCORPORATED IN SEMICONDUCTOR MEMORY DEVICE FOR BOOSTING SELECTED WORD LINE OVER POWER VOLTAGE LEVEL

FIELD OF THE INVENTION

This invention relates to a semiconductor memory device and, more particularly, to a row address decoder unit incorporated in the semiconductor memory device.

DESCRIPTION OF THE RELATED ART

A dynamic random access memory device is progressively increased in memory capacity, and each memory cell is miniaturized. The memory cell is implemented by a series combination of a switching transistor and a storage capacitor, and the dimensions of the storage capacitor are decreased with miniaturization. Therefore, it is preferable to transfer the voltage level on the associated bit line to the storage capacitor without any potential drop so as to compensate the decrement of the capacitance due to the miniaturization, and a word line driver boosts a selected word line over the voltage level on the bit line by the threshold of the switching transistor. This feature is indispensable to next generation 16 mega-bit or 64 mega-bit dynamic random access memory devices.

A typical example of the row addressing system incorporated in the prior art 16 mega-bit dynamic random access memory device is illustrated in FIG. 1, and the row addressing system largely comprises a row address decoder unit 1 and a word line driver unit 2. The row address decoder unit 1 is implemented by a plurality of row address decoder circuits 1a, and row address predecoded signals are selectively supplied to the row address decoder circuits 1a. The word line driver unit 2 is also implemented by a plurality of word line driver circuits 2a, and the word line driver circuits 2a are respectively associated with the row address decoder circuits 1a. The word line driver circuits 2a are respectively coupled with word lines WL1 to WLm, and, accordingly, each row address decoder circuit 1a is associated with each word line driver circuit 2a which in turn is associated with each word line.

Row addresses are respectively associated with the word lines WL1 to WLm, and the row address predecoded signals are indicative of one of the row addresses. The selected row address is discriminated by one of the row address decoder circuits 1a, and the associated word line driver 2a drives the selected word line over the voltage level on bit lines in synchronism with an activation signal ACT.

FIG. 2 illustrates another prior art row addressing system incorporated in a 64 mega-bit dynamic random access memory device, and the row addressing system largely comprises a row address decoder unit 3 responsive to row address predecoded signals and a word line driver unit 4 for selectively driving word lines WL11/WL12 to WLm1/WLm2. The row address decoder unit 3 is also implemented by a plurality of row address decoder circuits respectively associated with the word lines WL11 to WLm2, and the word line driver unit 4 is fabricated from a plurality of word line driver circuits 4a and 4b. Although the word lines WL11 to WLm2 are respectively driven by the word line driver circuits 4a and 4b, each row address decoder circuit is shared between the word line driver circuits 4a and 4b, and, accordingly, a row address decoded signal DE is distributed to the associated word line driver circuits 4a and 4b.

The word lines WL11/WL12 to WLm1/WLm2 are grouped, and row addresses are respectively assigned to the word line groups WL11/WL12 to WLm1/WLm2. The word line driver circuits 4a and 4b are selectively activated with activation signals ACT1 and ACT2, and the word line driver circuits 4a and 4b becomes responsive to the row address decoded signal DE for selectively driving the word lines WL11 to WLm2.

Thus, the row addressing system is broken down into the row address decoder unit 1 or 3 and the word line driver unit 2 or 4, and the word line driver circuits 2, 4a and 4b drive the associated word lines WL1 to WLm and WL11 to WLm2 over a positive voltage level on the bit lines.

Two typical examples of the word line driver are described hereinbelow. The first example shown in FIG. 3 comprises a series combination of n-channel enhancement type switching transistors Qn1 and Qn2 coupled between a power signal line 5 and a ground voltage line GND, and an n-channel enhancement type bootstrapping transistor Qn3 coupled between a control signal line 6 and the gate electrode of the n-channel enhancement type bootstrapping transistor Qn3. A row address decoded signal DE is directly applied to the source node of the n-channel enhancement type bootstrapping transistor Qn3, and the complementary signal CDE of the row address decoded signal DE is applied to the gate electrode of the n-channel enhancement type switching transistor Qn2. A word line WL is coupled with the common drain node of the n-channel enhancement type switching transistors Qn1 and Qn2, and is selectively coupled with the power signal line 5 and the ground voltage line GND.

FIG. 4 illustrates a selection of the word line WL. If the row address predecoded signals are indicative of the row address assigned to the word line WL, the associated row address decoder circuit shifts the row address decoded signal DE toward an active voltage level VBOOT at time t1, and the gate electrode N1 of the n-channel enhancement type switching transistor Qn1 goes up toward a certain voltage level lower than the active voltage level VBOOT by the threshold of the bootstrapping transistor Qn3 at time t2. An inverter IV1 shifts the complementary signal CDE toward the ground voltage level at time t3, and the complementary signal CDE causes the n-channel enhancement type switching transistor Qn2 to turn off. Then, the word line WL is electrically isolated from the ground voltage line GND. A boosted voltage level VBOOT is supplied to the gate electrode of the n-channel enhancement type bootstrapping transistor Qn3, and the activation signal ACT goes up over the positive voltage level Vcc, and the gate electrode N1 is bootstrapped due to the capacitive coupling between the drain and the gate electrode thereof at time t4. The boosted gate electrode N1 allows the activation signal ACT to pass the n-channel enhancement type switching transistor Qn1 without any potential drop, and, accordingly, the word line WL reaches the same voltage level as the activation signal ACT at time t5. In the sequence shown in FIG. 4, the active voltage level VXSW is set to the boosted voltage level VBOOT.

A bootstrapped voltage VNBOOT at the gate electrode N1 of the switching transistor Qn1 is given by Equation (1).

$$VNBOOT = (VXSW - Vtn) + Vact \times Cg/(Cg + CL) \quad (1)$$

where VXSW is the active voltage level of the row address decoded signal, Vtn is the threshold of the n-channel enhancement type bootstrapping transistor Qn3, Vact is an active high voltage level of the activation signal ACT, Cg is the capacitance between the gate electrode and the drain node of the switching transistor Qn1, and CL is the load capacitance at the gate electrode of the switching transistor Qn1. In order to allow the associated word line to reach the active high voltage level Vact, the boosted voltage VNBOOT is equal to or greater than the sum of the active high voltage level Vact and the threshold Vtn of the bootstrapping transistor Qn3 as shown below.

$$VNBOOT > Vact + Vtn \quad (2)$$

Equation 3 is obtained from Equations (1) and (2).

$$(VXSW - 2Vtn)/Vact \geq CL/(Cg + CL) \quad (3)$$

As will be understood from Equation 3, it is necessary to set the active voltage level VXSW of the row address decoded signal DE to a higher level or to increase the gate capacitance Cg. However, the prior art word line driver unit, especially of the type shown in FIG. 2 occupies a substantial amount of real estate, and it is not feasible to enlarge the n-channel enhancement type switching transistor Qn1. On the other hand, the row address decoded signal DE is hardly increasable, because the electric power consumption is deteriorated. In an actual prior art product, the positive power voltage Vcc, the activation signal ACT and the threshold Vtn are regulated to 3.3 volts, 4.0 volts and 0.8 volt, and the ratio between the gate capacitance Cg and the capacitive load CL is 4:1. If the positive power voltage Vcc is temporally decreased at 20%, the gate electrode N1 barely reaches 5.1 volts, and the n-channel enhancement type switching transistor Qn1 behaves in the saturation region for transferring the activation signal ACT. This results in that the selected word line slowly rises.

Turning to FIG. 5 of the drawings, the second example of the word line driver circuit comprises a complementary inverter IV2 implemented by a series combination of a p-channel enhancement type switching transistor Qp4 and an n-channel enhancement type switching transistor Qn5 coupled between a power supply line and a ground voltage line GND, and an n-channel enhancement type discharging transistor Qn6 coupled between the common drain node N2 of the series combination and the ground voltage line GND. A row address decoded signal DE is applied to the gate electrodes of the series combination, and the common drain node N2 is coupled with a word line WL. A complementary signal CACT of the activation signal ACT is applied to the gate electrode of the n-channel enhancement type discharging transistor Qn6, and the n-channel enhancement type discharging transistor Qn6 guarantees the non-selected state of the word line WL against the row address decoded signal DE of the active low level while the activation signal ACT remains inactive low. In this instance, when row address predecoded signals does not select the word line WL, the row address decoded signal DE is expected to reach a boosted level VBOOT of the activation signal ACT so that the p-channel enhancement type switching transistor Qp4 turns off.

FIG. 6 illustrates a selection of the word line WL. Assuming now that the row address predecoded signals are indicative of the row address assigned to the word line WL, the row address decoded signal DE is decayed toward the active low voltage level at time t11, and the complementary signal CACT starts decaying at time t12. The n-channel enhancement type switching transistor Qn5 turns off with the row address decoded signal DE of the active low voltage level, thereby isolating the word line WL from the ground voltage line GND. The n-channel enhancement type discharging transistor Qn6 also turns off with the complementary signal CACT of the low voltage level, and the word line WL is perfectly isolated from the ground voltage line GND. The activation signal ACT starts rising at time t13. If potential difference between the row address decoded signal DE and the activation signal ACT exceeds the threshold of the p-channel enhancement type switching transistor Qp4, the p-channel enhancement type switching transistor Qp4 turns on, and the word line WL start rising toward the boosted voltage level VBOOT at time t14. Thus, the word line driver circuit shown in FIG. 5 drives the word line WL over the positive voltage level Vcc, and the row address decoded signal DE should be boosted over the positive voltage level Vcc.

FIG. 7 illustrates a typical example of the row address decoder circuit, and the row address decoder circuit largely comprises a decoder section 7 and an inverter section 8. The decoder section 7 has a series combination of a p-channel enhancement type main charging transistor Qp7 and n-channel enhancement type switching transistors Qn8, Qn9 and Qn10 coupled between a boosted voltage line VBOOT and a ground voltage line GND, and a p-channel enhancement type auxiliary charging transistor Qp11 coupled in parallel to the p-channel enhancement type main charging transistor Qp7. A reset signal RST is applied to the gate electrode of the p-channel enhancement type main charging transistor Qp7, and the row address predecoded signals are applied to the gate electrodes of the n-channel enhancement type switching transistors Qn8 to Qn10.

The row address decoder circuit firstly enters a resetting phase, and the p-channel enhancement type main charging transistor Qp7 turns on for charging the drain node N3 to the boosted voltage level VBOOT. Upon completion of the charging, the row address decoder circuit proceeds a decoding phase, and the reset signal RST is recovered to the inactive high voltage level Vcc. The n-channel enhancement type switching transistors Qn8 to Qn10 are responsive to the row address predecoded signals, and selectively turn on and off depending upon the row address predecoded signals Xi. If all of the row address predecoded signals Xi are active high voltage level, the n-channel enhancement type switching transistors Qn8 to Qn10 turn on, and the drain node N3 is discharged through the n-channel enhancement type switching transistors Qn8 to Qn10. However, if at least one row address predecoded signal Xi is inactive low level, the drain node N3 is kept at the boosted voltage level VBOOT. Thus, the decoder section 7 decodes the row address predecoded signals, and produces a row address decoded signal DE.

The inverter section 8 is implemented by a series combination of a p-channel enhancement type switching transistor Qp12 and an n-channel enhancement type switching transistor Qn13 coupled between the boosted voltage line VBOOT and the ground voltage line GND, and the drain node N3 is coupled with the gate electrodes of the switching transistors Qp12 and Qn13. The inverter section 8 is responsive to the row address decoded signal DE, and produces the complementary signal CDE.

The complementary signal CDE is fed back to the gate electrode of the p-channel enhancement type auxiliary charging transistor Qp11, and the p-channel enhancement type auxiliary charging transistor Qp11 prevents the drain node N3 from undesirable floating state.

FIG. 8 illustrates the behavior of the row address decoder circuit shown in FIG. 7. Assuming now that the resetting phase is expired at time t21, the reset signal RST is recovered to the inactive boosted voltage level VBOOT, and the row address predecoded signals Xi are supplied to the n-channel enhancement type switching transistors Qn8 to Qn10 at time t22. Since all of the row address predecoded signals Xi are the active level Vcc, the n-channel enhancement type switching transistors Qn8 to Qn10 turn on, and the drain node N3 is discharged. For this reason, the row address decoded signal DE starts decaying at time t23, and the inverter section 8 allows the complementary signal CDE to start rising at time t24.

In the prior art row address decoder circuit shown in FIG. 7, it is necessary to boost the reset signal RST over the power voltage level Vcc, and the reset signal RST is distributed to all of the row address decoder circuits. This results in a large amount of current consumption. In fact, a 64 mega-bit dynamic random access memory device uses the reset signal RST over the power voltage level Vcc at 3.3 volts to the boosted level VBOOT at 4.0 volts, and the row address decoder circuits consume 3 milliamperes to 5 milliamperes.

Another prior art row address decoder circuit is illustrated in FIG. 9, and largely comprises a decoding section 9, an inverter section 10 and a booster section 11. The decoding section 9 and the inverter section 10 are similar in arrangement to the decoding section 7 and the inverter section 8, but are coupled with a power voltage line Vcc instead of the boosted voltage line VBOOT. For this reason, the circuit components are labeled with the references designating the components corresponding thereto without detailed description. The booster section is comprises a first series combination of a p-channel enhancement type switching transistor Qp14 and an n-channel enhancement type switching transistor Qn15 and a second series combination of a p-channel enhancement type switching transistor Qp16 and an n-channel enhancement type switching transistor Qn17, and the first and second series combinations are coupled in parallel between a boosted voltage line VBOOT and a ground voltage line GND. The decoder section 9 and the inverter section 10 are respectively coupled with the gate electrode of the n-channel enhancement switching transistor Qn15 and the gate electrode of the n-channel enhancement type switching transistor Qn17, and the common drain nodes N4 and N5 of the first and second series combinations are respectively coupled with the gate electrodes of the p-channel enhancement type switching transistors Qp16 and Qp14.

FIG. 10 illustrates the circuit behavior of the row address decoder circuit shown in FIG. 9. Assuming now that the resetting phase is expired at time t31, the reset signal RST is recovered to the inactive power voltage level Vcc, and the p-channel enhancement type main charging transistor Qp7 keeps the drain node N3 at the power voltage level Vcc. The row address predecoded signals Xi are assumed to be the high voltage level indicative of selection of the associated word line, and start rising at time t32. All of the n-channel enhancement type switching transistors Qn8 to Qn10 turn on, and the drain node N3 is discharged therethrough. The inverter section 10 supplies current to the output node thereof, and the output node is lifted to the positive power voltage level Vcc.

The drain node N3 keeps the n-channel enhancement type switching transistor Qn15 off, and the inverter section 10 allows the n-channel enhancement type switching transistor Qn17 to turn on. The common drain node N4 keeps the p-channel enhancement type switching transistor Qp16 off, and the row address decoded signal DE starts decaying at time t33. The other common drain node N5 is, accordingly, decayed, and allows the p-channel enhancement type switching transistor Qp14 to turn on. Then, the complementary signal CDE is boosted to the boosted voltage level VBOOT at time t33.

The row address decoder circuit thus arranged does not require the reset signal RST boosted to the voltage level VBOOT, and the current consumption is less than that of the row address decoder circuit shown in FIG. 7. However, the booster section 11 is indispensable for the row address decoder circuit shown in FIG. 9, and occupies a larger amount of real estate rather than the row address decoder circuit shown in FIG. 7.

As will be described hereinbefore, the prior art row address decoder circuits suffer from either current consumption or occupation area, and there is not known any approach to achieve to a row address decoder occupied on a small amount of real estate without sacrifice of current consumption.

SUMMARY OF THE INVENTION

It is therefore an important object of the present invention to provide a row addressing system which is simple in circuit arrangement and consumes a small amount of current.

To accomplish the object, the present invention proposes to directly couple a resetting means and a decoder means with a reset node and a set node of a flip flop means coupled with a source of boosted voltage.

In accordance with the present invention, there is provided a row addressing system incorporated in a semiconductor memory device for selectively driving word lines coupled with memory cells, comprising: a) a row address decoder unit responsive to internal row address signals for producing a row selecting signal, and including a plurality of row address decoder circuits, each of the plurality of row address decoder circuits having a-1) set and reset nodes for producing the row selecting signal shifted between a boosted voltage level indicative of selected state and a constant voltage level indicative of non-selected state, a-2) a flip flop means coupled between a source of the boosted voltage level and the set and reset nodes, and maintaining voltage levels at the respective set and reset nodes, a-3) a resetting means coupled between the reset node and a source of the constant voltage level, and responsive to a precharging signal of a power voltage level regulated between the boosted voltage level and the constant voltage level for charging the set node to the boosted voltage level, and a-4) a decoder means coupled between the set node and the source of the constant voltage level, and responsive to predetermined internal row address signals selected from the internal row address signals for controlling the set node between the boosted voltage level and the constant voltage level; and b) a word line driver unit coupled between the row address decoder unit and the word lines, and responsive to the row selecting signal for selectively driving the word lines over the power voltage level.

BRIEF DESCRIPTION OF THE DRAWINGS

The features and advantages of the semiconductor memory device according to the present invention will be more clearly understood from the following description taken in conjunction with the accompanying drawings in which:

FIG. 11 is a circuit diagram showing the arrangement of an essential part of a dynamic random access memory device according to the present invention;

FIG. 12 is a diagram showing the waveforms of essential signals used in the dynamic random access memory device shown in FIG. 11;

DESCRIPTION OF THE PREFERRED EMBODIMENTS

First Embodiment

Figure 1:
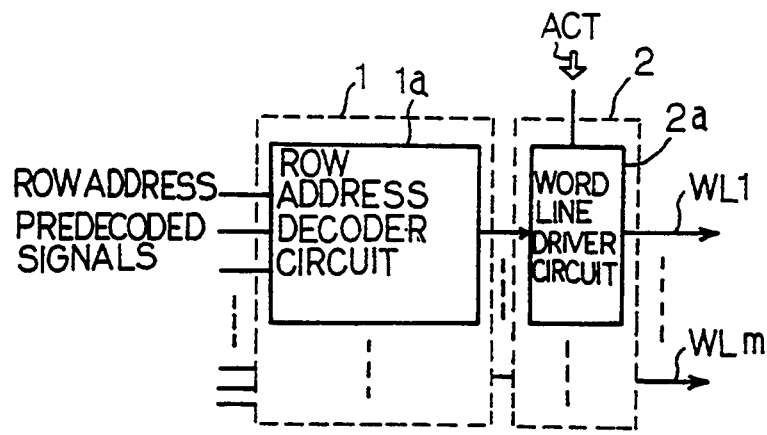
FIG. 1 is a block diagram showing the word line driver incorporated in the prior art 16 mega-bit dynamic random access memory device.

Referring to FIG. 11 of the drawings, a dynamic random access memory device embodying the present invention is fabricated on a single semiconductor chip 21, and a memory cell array 22 is incorporated in the dynamic random access memory device. The memory cell array 22 is fabricated from a plurality of memory cells M11 to M1n, M21 to M2n, ..., Ml1 to Mln and Mm1 to Mmn arranged in rows and columns. In this instance, each of the memory cells M11 to Mmn is implemented by a series combination of an n-channel enhancement type switching transistor Qn20 and a storage capacitor CP, and a data bit is stored in the storage capacitor CP in the form of electric charges.

The rows of memory cells M11 to Mmn are associated with a plurality of word lines WL1, WL2, WLl and WLm, and the word lines WL1 to WLm are coupled with the gate electrodes of the n-channel enhancement type switching transistors of the respective associated rows of memory cells.

The columns of memory cells M11 to Mmn are associated with a plurality of bit lines BL1, BL2, ..., BLm and BLn, and the bit lines BL1 to BLn are coupled with the drain nodes of the n-channel enhancement type switching transistors of the respective associated columns of memory cells. For example, the memory cells M11 to Ml1 and the memory cells M21 to Mm1 are respectively associated with the bit lines BL1 and BL2. Every other bit line such as BL1 or BLn is paired with the adjacent bit line BL2 or BLn, and every adjacent two bit lines paired with one another form a bit line pair.

A precharging circuit 23 is coupled with the bit line pairs, and charges and equalizes the bit lines BL1 to BLn at an intermediate voltage level between a power voltage level Vcc and a ground voltage level. The bit line pairs are further coupled with a sense amplifier circuit array 24, and the bit line pairs propagate potential differences indicative of data bits between the memory cell array 22 and the sense amplifier circuit array 24. The sense amplifier circuit array 24 has a plurality of sense amplifier circuits respectively associated with the bit line pairs, and the sense amplifier circuits develop the potential differences. In this instance, the developed potential difference reaches the power voltage level Vcc and the ground voltage level. Although a column addressing system is coupled with the sense amplifier circuit array 24, no description is incorporated hereinbefore, because the column addressing system is less important for the present invention.

The word lines WL1 to WLm are selectively driven by a row addressing system 25, and the row addressing system 25 has a row address buffer unit 25a, a row address decoder unit 25b and a word line driver unit 25c. The row address buffer unit 25a temporally stores row address bits, and produces row address predecoded signals Xi to Xj. In this instance, the row address predecoded signals Xi to Xj serve as internal row address signals. The word line driver unit 25c has a plurality of word line driver circuits, and selectively drives the word lines WL1 to WLm to a boosted voltage level VBOOT over the power voltage level Vcc.

The row address buffer unit 25b has a plurality of row address decoder circuits 25d which are identical in circuit arrangement with one another. Each of the row address buffer circuits 25d comprises a flip flop circuit 25e coupled between a source of boosted voltage level VBOOT and set and reset nodes ST and RST, a reset circuit 25f coupled between the reset node RST and a ground voltage line GND and a decoder circuit 25g coupled between the set node ST and the ground voltage line GND.

The flip flop circuit 25e is implemented by a parallel combination of p-channel enhancement type switching transistors Qp21 and Qp22, and the gate electrodes of the switching transistors Qp21 and Qp22 are respectively coupled with the reset and set nodes RST and ST. If one of the reset and set nodes RST and ST is decayed to the ground voltage level, the other of the reset and set nodes RST and ST is charged through the flip flop circuit 25e to the boosted voltage level VBOOT, and the flip flop circuit 25e maintains the voltage levels at the reset and set nodes RST and ST.

The reset circuit 25f is implemented by an n-channel enhancement type switching transistor Qn23, and a precharging signal PC of the power voltage level Vcc is applied to the gate electrode of the switching transistor Qn23 before change of the row address predecoded signals Xi. Though not shown in FIG. 11, the precharging signal PC is produced by a timing generator, and the timing generator sequentially produces a series of timing signals including the precharging signal PC upon discrimination of a new access. With the precharging signal PC, the n-channel enhancement type switching transistor Qn23 turns on, and the reset node RST is grounded through the n-channel enhancement type switching transistor Qn23. Then, the flip flop circuit 25e charges the set node ST to the boosted voltage level, and maintains the boosted voltage level VBOOT at the set node ST and the ground voltage level at the reset node RST.

The decoder circuit 25g is implemented by a series combination of n-channel enhancement type switching transistors Qn24, Qn25 and Qn26 coupled between the set node ST and the ground voltage line GND, and the row address predecoded signals Xi are respectively supplied to the gate electrodes of the switching transistors Qn24 to Qn26. If all of the row address predecoded signals Xi are the power voltage level corresponding to logic "1" level, the row address predecoded signals Xi are indicative of selected state, and the set node ST is discharged to the ground voltage level. However, when at least one of the row address predecoded signals Xi is the ground voltage level corresponding to logic "0" level, the decoder circuit 25g keeps the set node ST at the boosted voltage level VBOOT, and the reset node RST is kept at the ground voltage level. A row address decoded signal DE and the complementary signal CDE thereof are respectively produced at the reset node RST and the set node ST, and are supplied to the word line driver unit 25c.

Figure 3:
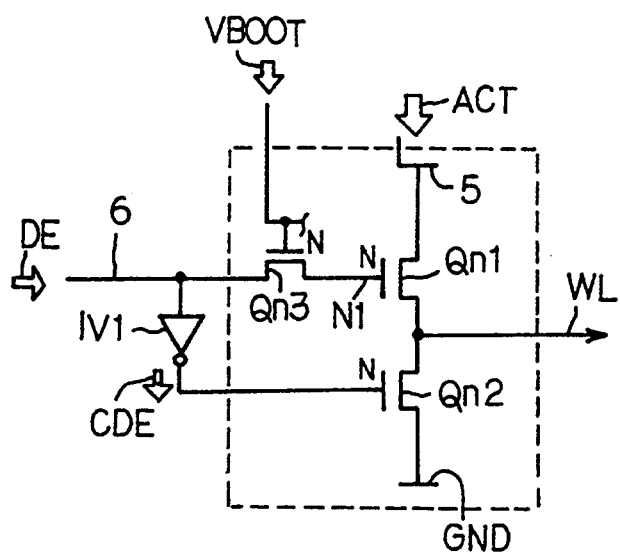
FIG. 3 is a circuit diagram showing the circuit arrangement of the prior art word line driver.
Figure 4:
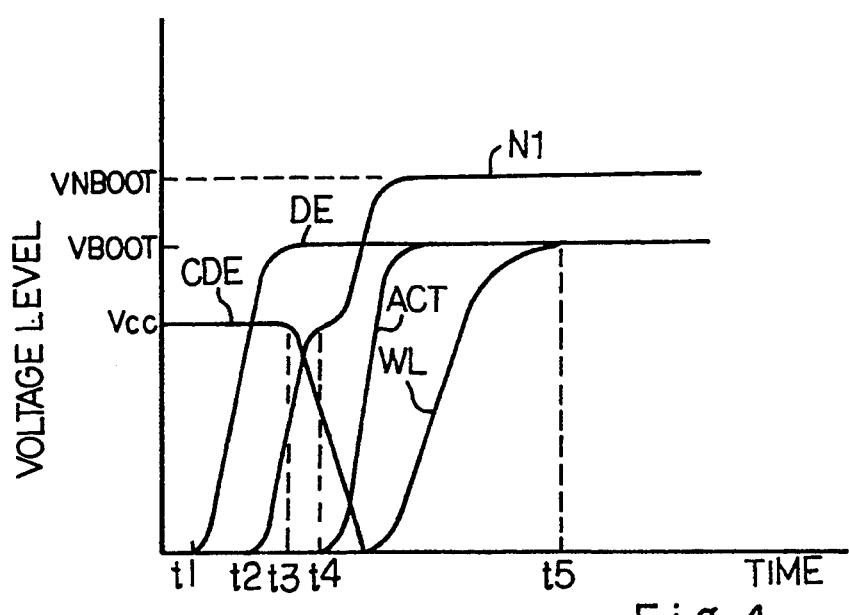
FIG. 4 is a diagram showing the waveforms of the essential signals for the prior art word line driver.
Figure 5:
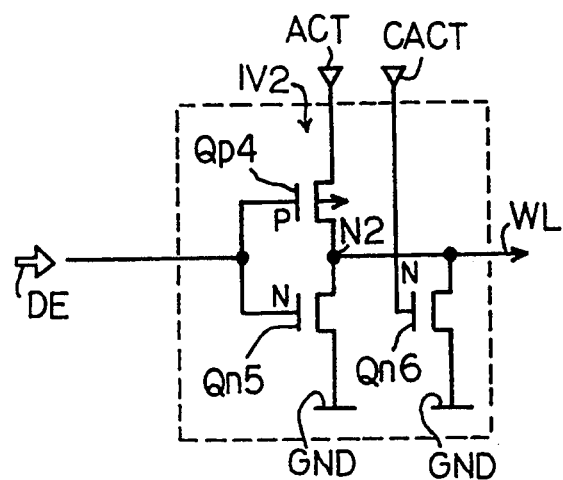
FIG. 5 is a circuit diagram showing the circuit arrangement of another prior art word line driver.
Figure 6:
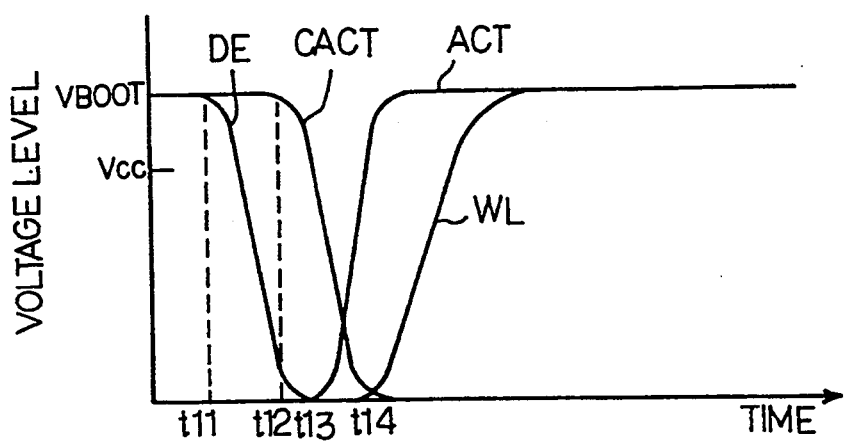
FIG. 6 is a diagram showing the waveforms of the essential signals for the prior art word line driver.

The word line driver unit 25c has a plurality of word line driver circuits, and each word line driver circuit is, by way of example, similar in circuit arrangement to the word line driver circuit shown in FIG. 3. The word line driver circuits are responsive to the row address decoded signal DE and the complementary signal CDE for selectively driving the word lines WL1 to WLm over the positive power voltage level Vcc, and the storage capacitors of the memory cells coupled therewith are conducted through the n-channel enhancement type switching transistors with the associated bit lines. In this instance, the boosted voltage level VBOOT is high enough for the word line driver circuits to drive the word lines to a certain voltage level higher than the power voltage level vcc by the threshold of the n-channel enhancement type switching transistors of the memory cells.

The row addressing system 25 thus arranged behaves as follows. Assuming now that the row address bits are indicative of a row address assigned to one of the word lines associated with the row address decoder circuit 25e, the precharging signal PC goes down from the power voltage level Vcc to the ground voltage level, and a precharging phase is completed at time t41. The amount of current consumed is relatively small in the precharging phase, because the precharging signal PC is at the power voltage level. Upon completion of the precharging phase, the n-channel enhancement type switching transistor Qn23 turns off. However, the reset node RST does not go up, because the set node ST at the boosted voltage level VBOOT causes the p-channel enhancement type switching transistor Qp22 to turn off.

The row address buffer unit 25a produces the row address decoded signals Xi at the power voltage level Vcc from the row address bits, and the row address predecoded signals Xi start rising at time t42. As a result, all of the n-channel enhancement type switching transistors Qn24 to Qn26 turn on, and the set node ST and, accordingly, the complementary signal CDE go down from the boosted voltage level VBOOT to the ground voltage level.

The set node ST thus decayed allows the p-channel enhancement type switching transistor Qp22 to turn on, and the reset node RST and, accordingly, the row address decoded signal DE go up to the boosted voltage level VBOOT at time t43. With the row address decoded signal DE at the boosted voltage level VBOOT and the complementary signal thereof CDE, the word line driver unit 25c drives the selected word line over the power voltage level, and a write-in operation or a read-out operation is carried out on one of the memory cells coupled with the selected word line.

Figure 7:
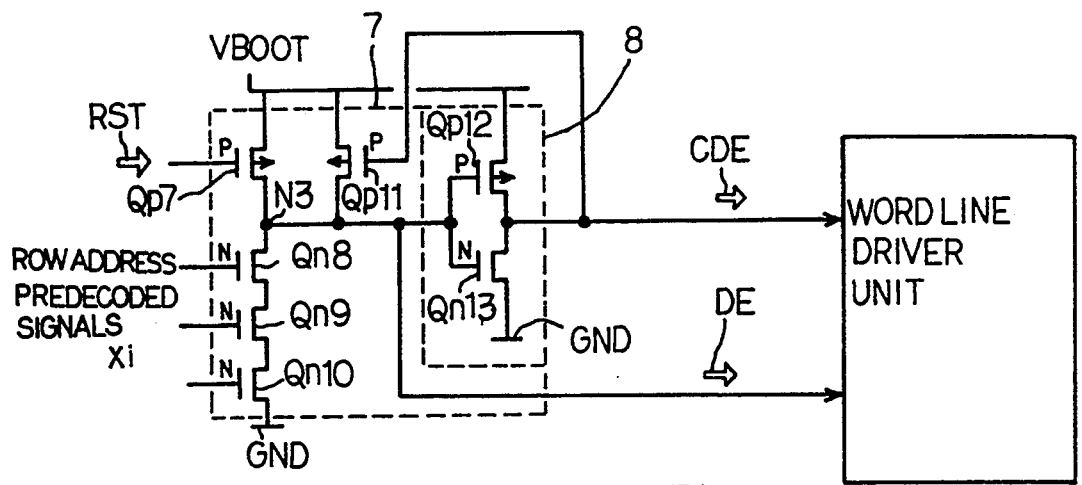
FIG. 7 is a circuit diagram showing the arrangement of the prior art row address decoder.
Figure 8:
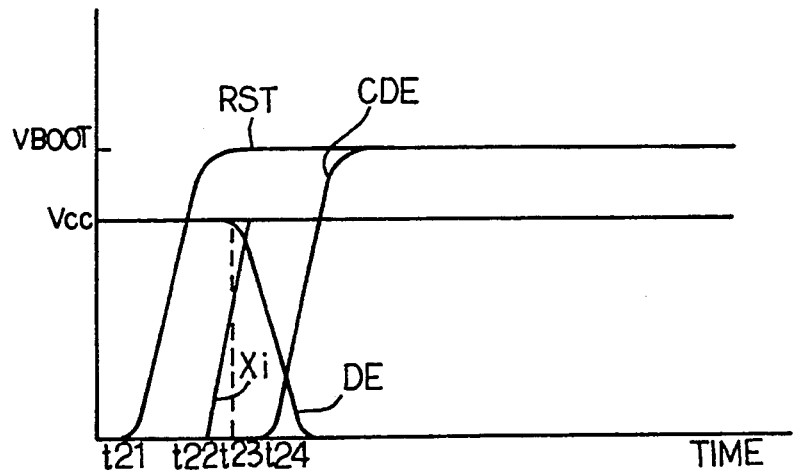
FIG. 8 is a diagram showing the waveforms of the essential signals for the prior art row address decoder.
Figure 9:
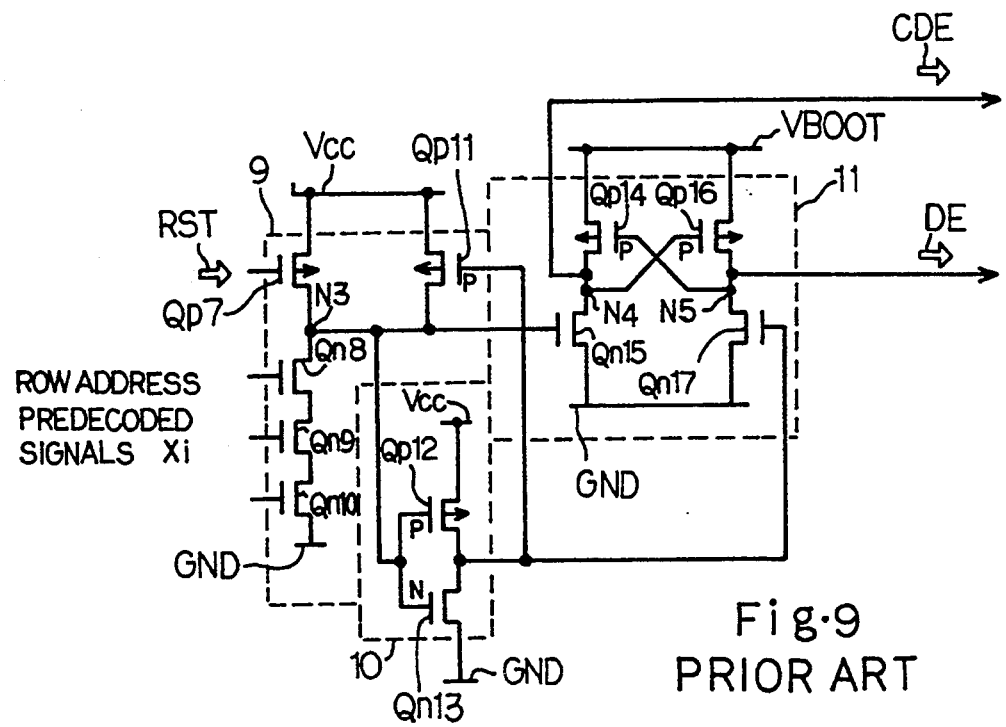
FIG. 9 is a circuit diagram showing the arrangement of another prior art row address decoder.
Figure 10:
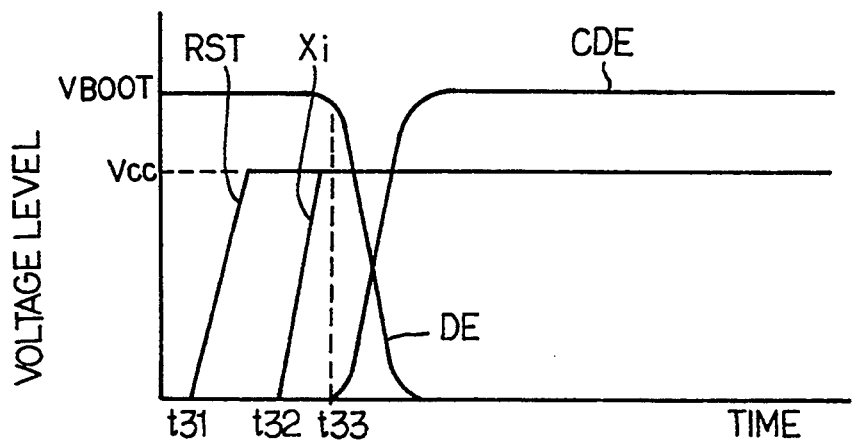
FIG. 10 is a diagram showing the waveforms of the essential signals for the prior art row address decoder.

As will be understood from the foregoing description, the row addressing system 25 according to the present invention is simple, because the flip flop circuit 25e is combined with the resetting circuit 25f/the decoder circuit 25g. Moreover, the row addressing system according to the present invention is decreased in electric power consumption, because the precharging signal PC does not exceed the power voltage level Vcc. In a 64 Mb DRAM, the row address decoder circuit 25d consumes 23 milliwatts at every access. However, the prior art row address decoder circuit shown in FIG. 7 requires 33 milliwatts.

Second Embodiment

Figure 13:
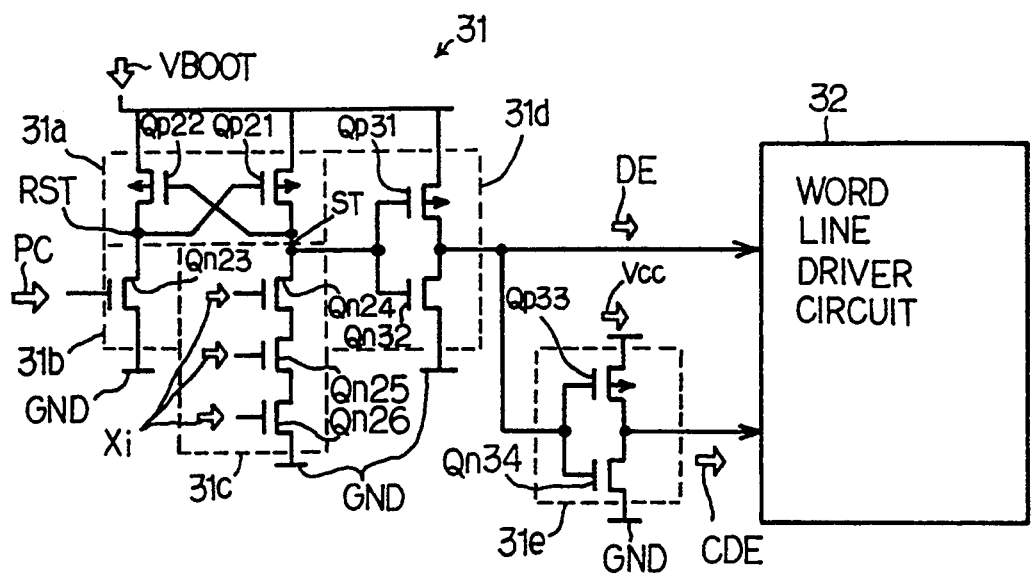
FIG. 13 is a circuit diagram showing the arrangement of an essential part of another dynamic random access memory device according to the present invention.

Turning to FIG. 13 of the drawings, another row address decoder circuit 31 embodying the present invention supplies a row address decoded signal DE and the complementary signal CDE thereof to a word line driver circuit 32, and the row address decoder circuit 31 comprises a flip flop circuit 31a, a reset circuit 31b, a decoder circuit 31c and two inverter circuits 31d and 31e. However, the flip flop circuit 31a, the reset circuit 31b and the decoder circuit 31c are similar in arrangement to those of the first embodiment, and circuit components thereof are labeled with the same references designating the corresponding components of the first embodiment without detailed description for the sake of simplicity. The inverter circuit 31d is implemented by a series combination of a p-channel enhancement type switching transistor Qp31 and an n-channel enhancement type switching transistor Qn32 coupled between the source of boosted voltage level VBOOT and the ground voltage line GND, and the inverter circuit 31e is implemented by a series combination of a p-channel enhancement type switching transistor Qp33 and an n-channel enhancement type switching transistor Qn34 coupled between the source of power voltage level Vcc and the ground voltage line GND.

Figure 14:
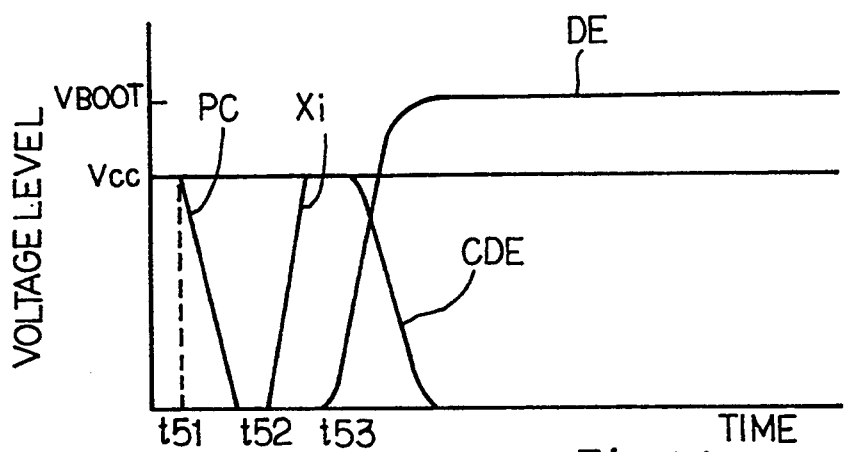
FIG. 14 is a diagram showing the waveforms of essential signals used in the dynamic random access memory device shown in FIG. 13.

Circuit behavior of the second embodiment is illustrated in FIG. 14. The precharging signal PC is decayed from the power voltage level Vcc to the ground voltage level at time t51, and the flip flop circuit 31a keeps the set node ST at the boosted voltage level VBOOT. If all of the row address predecoded signals Xi go up to the power voltage level Vcc at time t52, the set node ST is discharged through the n-channel enhancement type switching transistors Qn24 to Qn26, and the inverter circuit 31d allows the row address decoded signal DE to go up to the boosted voltage level VBOOT at time t53. The row address decoded signal DE is supplied to not only the word line driver circuit 32 but also the inverter circuit 31e, and the inverter circuit 31e causes the complementary signal CDE to go down from the power voltage level Vcc to the ground voltage level. The word line driver circuit 32 drives an associated word line or lines (not shown) over the power voltage level Vcc, and allows the voltage level on associated bit lines (not shown) to reach storage capacitors of associated memory cells (not shown) without reduction in voltage level.

Figure 2:
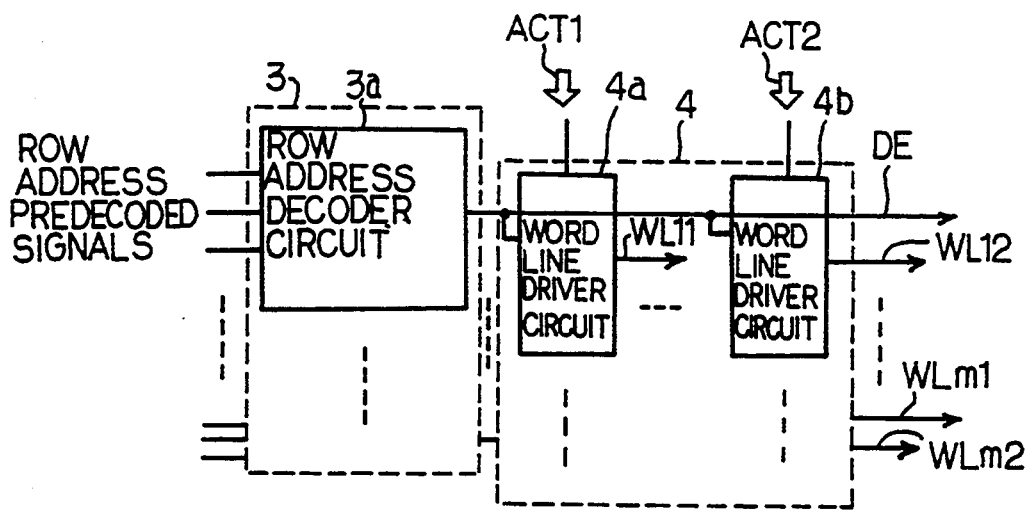
FIG. 2 is a block diagram showing the word line driver incorporated in the prior art 64 mega-bit dynamic random access memory device.

The row address decoder circuit 31 thus arranged is attractive to a word line driver unit as shown in FIG. 2, because the inverter circuits 31d and 31e can quickly charge and discharge load capacitances with large current driving capabilities thereof. Moreover, the inverter circuit 31e does not consume a large amount of electric power, because the source of power voltage line Vcc supplies electric power to the inverter circuit 31e.

Third Embodiment

Figure 15:
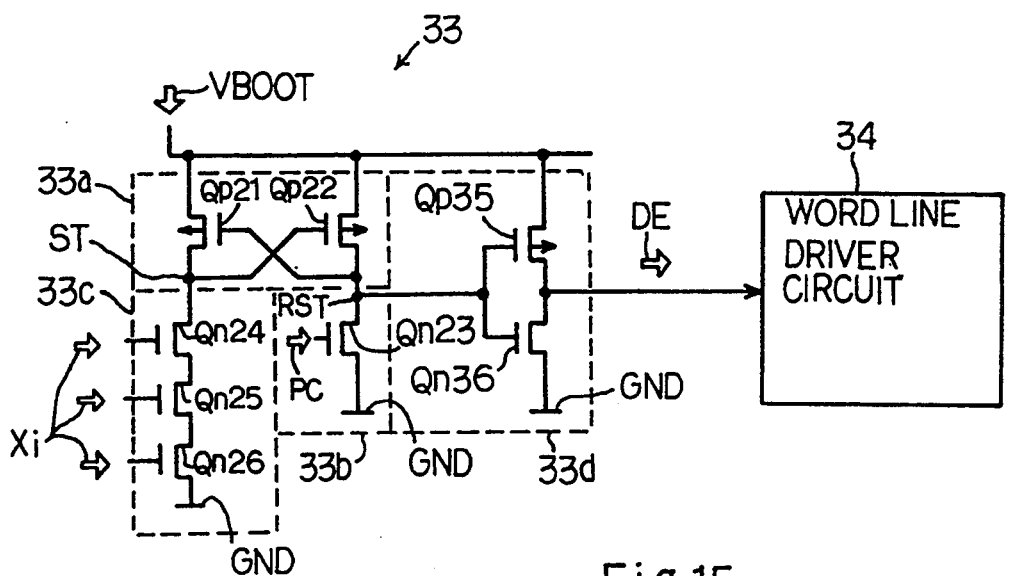
FIG. 15 is a circuit diagram showing the arrangement of an essential part of yet another dynamic random access memory device according to the present invention.

Turning to FIG. 15 of the drawings, yet another word line driver circuit 33 embodying the present invention supplies a row address decoded signal DE to a word line driver circuit 34, and the row address decoder circuit 33 comprises a flip flop circuit 33a, a reset circuit 33b, a decoder circuit 33c and an inverter circuit 33d. However, the flip flop circuit 33a, the reset circuit 33b and the decoder circuit 33c are similar in arrangement to those of the first embodiment, and circuit components thereof are labeled with the same references designating the corresponding components of the first embodiment without detailed description for the sake of simplicity.

The inverter circuit 33d is implemented by a series combination of a p-channel enhancement type switching transistor Qp35 and an n-channel enhancement type switching transistor Qn36 coupled between the source of boosted voltage level VBOOT and the ground voltage line GND, and the p-channel enhancement type switching transistor Qp35 and the n-channel enhancement type switching transistor Qn36 are complementarily gated by the rest node RST.

Figure 16:
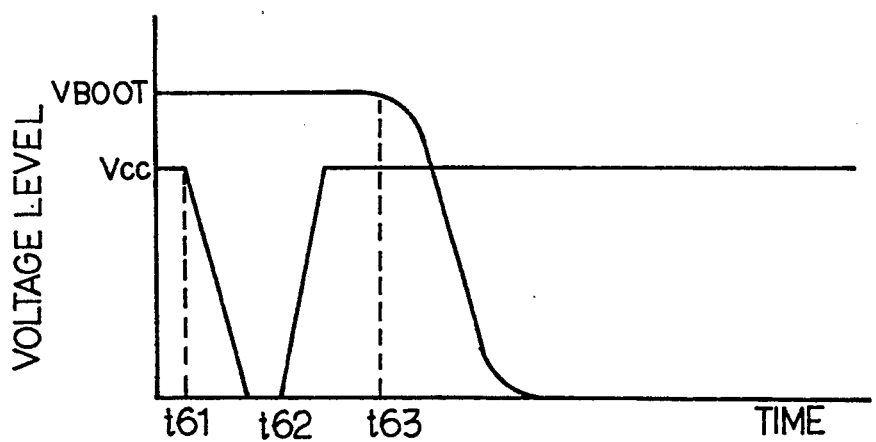
FIG. 16 is a diagram showing the waveforms of essential signals used in the dynamic random access memory device shown in FIG. 15.

Circuit behavior of the third embodiment is illustrated in FIG. 16. The precharging signal PC is decayed from the power voltage level Vcc to the ground voltage level at time t61, and the flip flop circuit 33a keeps the reset node RST and the set node ST at the ground voltage level and the boosted voltage level VBOOT, respectively. If all of the row address predecoded signals Xi go up to the power voltage level Vcc at time t62, the set node ST is discharged through the n-channel enhancement type switching transistors Qn24 to Qn26, and the flip flop circuit 33a changes the reset node RST from the ground voltage level to the boosted voltage level VBOOT. The reset node RST at the boosted voltage level VBOOT allows the p-channel enhancement type switching transistor Qp35 and the n-channel enhancement type switching transistor Qn36 to turn off and on, and the row address decoded signal DE starts decaying at time t63. The word line driver circuit 34 drives an associated word line or lines (not shown) over the power voltage level Vcc, and allows the voltage level on associated bit lines (not shown) to reach storage capacitors of associated memory cells (not shown) without reduction in voltage level.

The row address decoder circuit 33 thus arranged is also attractive to a word line driver unit as shown in FIG. 2, because the inverter circuit 33d can quickly charge and discharge load capacitance coupled at the output node thereof.

Although particular embodiments of the present invention have been shown and described, it will be obvious to those skilled in the art that various changes and modifications may be made without departing from the spirit and scope of the present invention. For example, the row address decoder unit according to the present invention may be associated with any word line driver unit in so far as the word line driver unit requires the boosted voltage level. In the above described embodiments, the decoder circuit achieves the NAND operation on the row address predecoded signals. However, a decoder circuit may perform the NAND operation on not only the row address predecoded signals but also an enable signal.

What is claimed is:

1. A row addressing system incorporated in a semiconductor memory device for selectively driving word lines coupled with memory cells, comprising:
   a) a row address decoder unit responsive to internal row address signals for producing a row selecting signal, and including a plurality of row address decoder circuits, each of said plurality of row address decoder circuits having
      a-1) a set node and a reset node for producing said row selecting signal shifted between a boosted voltage level indicative of selected state and a constant voltage level indicative of non-selected state,
      a-2) a flip flop means coupled between a source of said boosted voltage level and said set and reset nodes, and maintaining voltage levels at said respective set and reset nodes,
      a-3) a resetting means coupled between said reset node and a source of said constant voltage level, and responsive to a precharging signal of a power voltage level regulated between said boosted voltage level and said constant voltage level for causing said flip flop means to charge said set node to said boosted voltage level, and
      a-4) a decoder means coupled between said set node and said source of said constant voltage level, and responsive to predetermined internal row address signals selected from said internal row address signals for controlling said set node between said boosted voltage level and said constant voltage level; and
   b) a word line driver unit coupled between said row address decoder unit and said word lines, and responsive to said row selecting signal for selectively driving said word lines over said power voltage level.

2. (Amended) A row addressing system as set forth in claim 1, in which said power voltage level, said constant voltage level and said boosted voltage level are respectively a positive voltage level, a ground voltage level and another positive voltage level high enough to allow a voltage level on a bit line to reach a storage capacitor of a memory cell without reduction in voltage level.

3. A row addressing system as set forth in claim 2, in which said flip flop means comprises a p-channel enhancement type first switching transistor and a p-channel enhancement type second switching transistor coupled in parallel between said source of said boosted voltage level and said set and reset nodes, gate electrodes of said p-channel enhancement type first and second switching transistors being coupled with drain nodes of said p-channel enhancement type second and first switching transistors, respectively.

4. A row addressing system as set forth in claim 3, in which said resetting means is implemented by an n-channel enhancement type third switching transistor coupled between said reset node and said source of said constant voltage level, said precharging signal being supplied to a gate electrode of said n-channel enhancement type third switching transistor.

5. A row addressing system as set forth in claim 4, in which said decoder means is implemented by a series combination of n-channel enhancement type fourth switching transistors coupled between said set node and said source of said constant voltage level, said internal address signals being supplied to gate electrodes of said n-channel enhancement type fourth switching transistors, respectively.

6. A row addressing system as set forth in claim 5, in which each row address decoder circuit further comprises:
   a-5) a first inverter circuit coupled between said source of said boosted voltage level and said source of said constant voltage level for producing the complementary signal of said row selecting signal.

7. A row addressing system as set forth in claim 6, in which said first inverter circuit is implemented by a series combination of a p-channel enhancement type fifth switching transistor and an n-channel enhancement type sixth switching transistor coupled between said source of said boosted voltage level and said source of said constant voltage level.

8. A row addressing system as set forth in claim 7, in which each row address decoder circuit further comprises
   a-6) a second inverter circuit coupled between a source of said power voltage level and said source of said constant voltage level for producing a non-inverted row selecting signal from said complementary signal.

9. A row addressing system as set forth in claim 8, in which said second inverter circuit is implemented by a series combination of a p-channel enhancement type seventh switching transistor and an n-channel enhancement type ninth switching transistor coupled between said source of said power voltage level and said source of said constant voltage level.

10. A row addressing system incorporated in a semiconductor memory device for selectively driving word lines coupled with memory cells, comprising:
   a) a row address decoder unit responsive to internal row address signals for producing a row selecting signal, and including a plurality of row address decoder circuits, each of said plurality of row address decoder circuits having
   a-1) a set node and a reset node for producing said row selecting signal shifted between a boosted voltage level indicative of selected state and a constant voltage level indicative of non-selected state,
   a-2) a flip flop circuit implemented by two switching transistors coupled between a source of said boosted voltage level and said set and reset nodes and having respective gate electrodes coupled with said reset node and said set node for maintaining voltage levels at said respective set and reset nodes,
   a-3) a resetting transistor coupled between said reset node and a source of said constant voltage level, and responsive to a precharging signal of a power voltage level regulated between said boosted voltage level and said constant voltage level for charging said set node to said boosted voltage level, and
   a-4) a decoder circuit implemented by a series of switching transistors coupled between said set node and said source of said constant voltage level and gated by predetermined internal row address signals selected from said internal row address signals for controlling said set node between said boosted voltage level and said constant voltage level; and
   b) a word line driver unit coupled between said row address decoder unit and said word lines, and responsive to said row selecting signal for selectively driving said word lines over said power voltage level.

* * * * *

UNITED STATES PATENT AND TRADEMARK OFFICE
CERTIFICATE OF CORRECTION

PATENT NO. : 5,373,479
DATED : December 13, 1994
INVENTOR(S) : Kenji Noda

It is certified that error appears in the above-indentified patent and that said Letters Patent is hereby corrected as shown below:

Column 11, line 54, delete "rest", and insert --reset--.

Signed and Sealed this

Second Day of April, 1996

Attest:

BRUCE LEHMAN

Attesting Officer

Commissioner of Patents and Trademarks